United States Patent
Ishida et al.

(10) Patent No.: US 7,968,472 B2
(45) Date of Patent: Jun. 28, 2011

(54) FILM FORMING METHOD AND FILM FORMING APPARATUS

(75) Inventors: Yoshihiro Ishida, Nirasaki (JP); Katsushige Harada, Nirasaki (JP); Takuya Sugawara, Nirasaki (JP)

(73) Assignee: Tokyo Electron Limited (JP)

( * ) Notice: Subject to any disclaimer, the term of this patent is extended or adjusted under 35 U.S.C. 154(b) by 84 days.

(21) Appl. No.: 12/536,913

(22) Filed: Aug. 6, 2009

(65) Prior Publication Data

US 2010/0035439 A1    Feb. 11, 2010

(30) Foreign Application Priority Data

Aug. 11, 2008   (JP) ................................ 2008-206976

(51) Int. Cl.
*H01L 21/31*      (2006.01)
*H01L 21/469*      (2006.01)

(52) U.S. Cl. .................. 438/785; 438/778; 427/255.19; 427/255.36

(58) Field of Classification Search .................. 438/785, 438/778; 427/255.19, 255.36
See application file for complete search history.

(56) References Cited

U.S. PATENT DOCUMENTS

| | | | |
|---|---|---|---|
| 6,534,395 B2 * | 3/2003 | Werkhoven et al. | 438/627 |
| 6,866,890 B2 * | 3/2005 | Kiryu et al. | 427/255.31 |
| 7,169,673 B2 * | 1/2007 | Ahn et al. | 438/287 |
| 7,423,311 B2 * | 9/2008 | Ahn et al. | 257/310 |
| 7,491,654 B2 * | 2/2009 | Song et al. | 438/778 |
| 2002/0001974 A1 * | 1/2002 | Chan | 438/785 |
| 2006/0199384 A1 * | 9/2006 | Ando et al. | 438/680 |
| 2010/0266751 A1 * | 10/2010 | Putkonen | 427/79 |

FOREIGN PATENT DOCUMENTS

| | | | | |
|---|---|---|---|---|
| EP | 1013793 | * | 6/2000 | 438/785 |
| JP | 2001-152339 | | 6/2001 | |
| JP | 2006-310754 | | 11/2006 | |

* cited by examiner

*Primary Examiner* — Matthew C Landau
*Assistant Examiner* — Vicki B Booker
(74) *Attorney, Agent, or Firm* — Cantor Colburn LLP

(57) ABSTRACT

The invention includes inserting an object to be processed into a processing vessel, which can be maintained vacuum, and making the processing vessel vacuum; performing a sequence of forming a $ZrO_2$ film on a substrate by alternately supplying zirconium source and an oxidizer into the processing vessel for a plurality of times and a sequence of forming $SiO_2$ film on the substrate by alternately supplying silicon source and an oxidizer into the processing vessel for one or more times, wherein the number of times of performing each of the sequences is adjusted such that Si concentration of the films is from about 1 atm % to about 4 atm %; and forming a zirconia-based film having a predetermined thickness by performing the film forming sequences for one or more cycles, wherein one cycle indicates that each of the $ZrO_2$ film forming sequences and the $SiO_2$ film forming sequences are repeated for the adjusted number of times of performances.

9 Claims, 8 Drawing Sheets

FILM FORMING METHOD AND FILM FORMING APPARATUS

CROSS-REFERENCE TO RELATED PATENT APPLICATIONS

This application claims the benefit of Japanese Patent Application No. 2008-206976, filed on Aug. 11, 2008, in the Japan Patent Office, the disclosure of which is incorporated herein in its entirety by reference.

BACKGROUND OF THE INVENTION

1. Field of the Invention

The present invention relates to a method and an apparatus for forming a zirconia-based film on a substrate to be processed, such as a semiconductor wafer.

2. Description of the Related Art

Recently, due to demands for higher integration and higher operating speed of a large scale integration (LSI), design rules of semiconductor devices that constitute a LSI are becoming finer. Along with the demands, there are also demands for increased capacity of capacitors that are used in dynamic random access memories (DRAMs) and demands for increased permittivity of dielectric films. It is necessary to crystallize such dielectric films to obtain higher permittivity, and thus a film with higher crystallinity is demanded. Furthermore, since some devices have limits in thermal budget, a film which may be formed or crystallized at a low temperature is demanded.

A zirconium oxide ($ZrO_2$) film is considered as a film with high permittivity, which is applicable to the above purposes, (see Reference 1).

Known techniques for forming a zirconium oxide film at a low temperature include an atomic layer deposition (ALD) process, in which source gas (precursor), e.g. tetrakis(ethylmethylamino)zirconium (TEMAZ), and oxidizer, e.g. $O_3$ gas, are supplied alternately (see Reference 2). Furthermore, zirconium oxide may be easily crystallized, and may be crystallized without inflicting negative effects on a device by forming a film at a low temperature by using the technique as described above or, additionally, annealing the film at a low temperature less than or equal to 450° C.

Such a dielectric film is required to exhibit not only high permittivity but also low leakage current. However, when a dielectric film is crystallized as described above, leakage current increases due to leakage from grain boundaries of crystals.

[Reference 1] Japanese Laid-Open Patent Publication No. 2001-152339

[Reference 2] Japanese Laid-Open Patent Publication No. 2006-310754

BRIEF SUMMARY OF THE INVENTION

To solve the above and/or other problems, the present invention provides a film forming method and a film forming apparatus for forming a zirconia-based film that is crystallized and exhibits small leakage current.

The present invention also provides a computer readable recording medium having recorded thereon the film forming method of forming a zirconia-based film.

According to an aspect of the present invention, there is provided a film forming method including inserting objects to be processed into a processing vessel that can be maintained vacuum, and making the processing vessel vacuum; performing a sequence of forming a $ZrO_2$ film on a substrate by alternately supplying a zirconium source and an oxidizer to the processing vessel a plurality of times and performing a sequence of forming a $SiO_2$ film on the substrate by alternately supplying a silicon source and the oxidizer to the processing vessel one or more times, wherein the number of times of performances of each of the sequences is adjusted such that Si concentration of the films is from about 1 atm % to about 4 atm %; and forming a zirconia-based film having a predetermined thickness by performing the film forming sequences for one or more cycles, wherein one cycle indicates that each of the $ZrO_2$ film forming sequences and the $SiO_2$ film forming sequences are repeated the adjusted number of times of performances.

Here, the number of times the zirconium source and the oxidizer are supplied during the formation of the $ZrO_2$ film and the number of times the silicon source and the oxidizer are supplied during the formation of the $SiO_2$ film may be adjusted such that the Si concentration of each of the films is from about 2 atm % to about 4 atm %.

Furthermore, a gas remaining in the processing vessel may be exhausted between the supplying of the zirconium source and the supplying of the oxidizer and between the supplying of the silicon source and the supplying of the oxidizer. After forming the zirconia-based film, the obtained films may be annealed at a temperature lower than or equal to 450° C.

Furthermore, the oxidizer may be at least one selected from the group consisting of $O_3$ gas, $H_2O$ gas, $O_2$ gas, $NO_2$ gas, NO gas, $N_2O$ gas, and a radical of $O_2$ gas and $H_2$ gas. The zirconium source and the silicon source may be organic metal compounds. It is preferable that the formed zirconia-based film has zirconia crystals. Also, it is preferable that the Si concentration of the films is adjusted in proportion to a ratio of the number of times which the Si source is supplied.

According to another aspect of the present invention, there is provided a film forming apparatus for forming a metal oxide layer with respect to objects to be processed, the film forming apparatus including a vertically cylindrical processing vessel which can be maintained vacuum; a supporting unit which supports the objects to be processed within the processing vessel; a heating unit which is formed to surround the outer surface of the processing vessel; a zirconium source supplying unit which supplies a zirconium source to the processing vessel; a silicon source supplying unit which supplies a silicon source to the processing vessel; an oxidizer supplying unit which supplies an oxidizer to the processing vessel; and a control unit which controls the zirconium source supplying unit, the silicon source supplying unit, and the oxidizer supplying unit, wherein the control unit controls the film forming apparatus: to insert the objects to be processed into a processing vessel, which can be maintained vacuum, to make the processing vessel vacuum; to perform a sequence of forming a $ZrO_2$ film on a substrate by alternately supplying the zirconium source and an oxidizer to the processing vessel a plurality of times and to perform a sequence of forming a $SiO_2$ film on the substrate by alternately supplying the silicon source and the oxidizer to the processing vessel one or more times, wherein the number of times of performances of each of the sequences is adjusted such that Si concentration of the films is from about 1 atm % to about 4 atm %; and to perform the film forming sequences for one or more cycles, wherein one cycle indicates that each of the $ZrO_2$ film forming sequences and the $SiO_2$ film forming sequences are repeated the adjusted number of times of performances.

Here, the control unit may control the film forming apparatus such that the number of times the zirconium source and the oxidizer are supplied during the formation of the $ZrO_2$ film and the number of times the silicon source and the oxidizer are supplied during the formation of the SiO$_2$ film are adjusted, so that the Si concentration of each of the films is from about 2 atm % to about 4 atm %.

Furthermore, the control unit may control the film forming apparatus such that a gas remaining in the processing vessel is exhausted between the supplying of the zirconium source and the supplying of the oxidizer and between the supplying of the silicon source and the supplying of the oxidizer. Furthermore, after forming zirconia-based film comprising the ZrO$_2$ film and the SiO$_2$ film, the control unit may control the film forming apparatus such that the obtained films are annealed at a temperature lower than or equal to 450° C. Also, it is preferable that the Si concentration of the films is adjusted in proportion to a ratio of the number of times which the Si source is supplied.

According to another aspect of the present invention, there is provided a computer readable recording medium having recorded thereon a computer program for executing the film forming method of any one of claims 1 through 8.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining exemplary embodiments of the invention with reference to the attached drawings.

Figure 1:
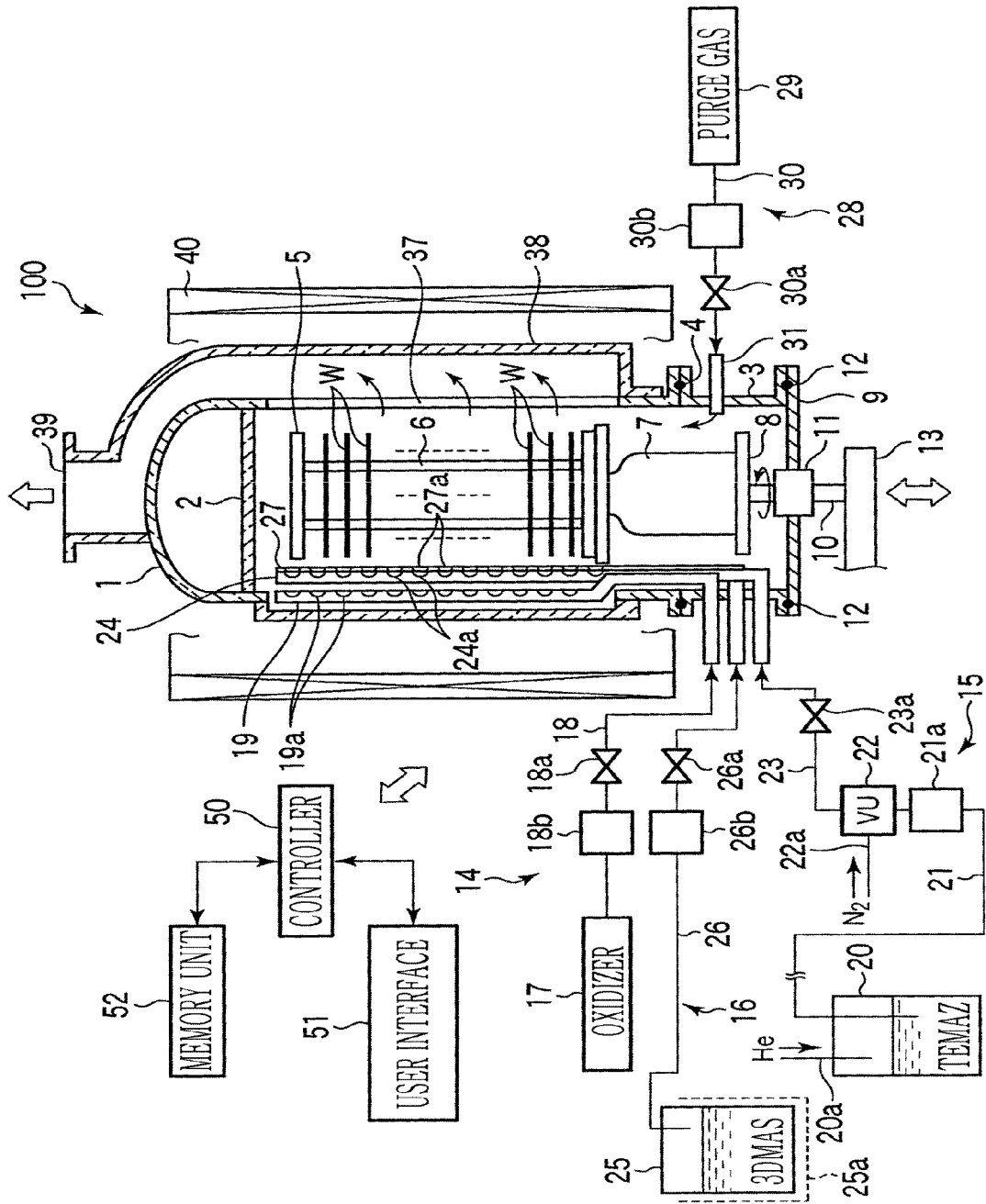
FIG. 1 is a longitudinal sectional view of a film forming apparatus for executing a film forming method according to an embodiment of the present invention.
Figure 2:
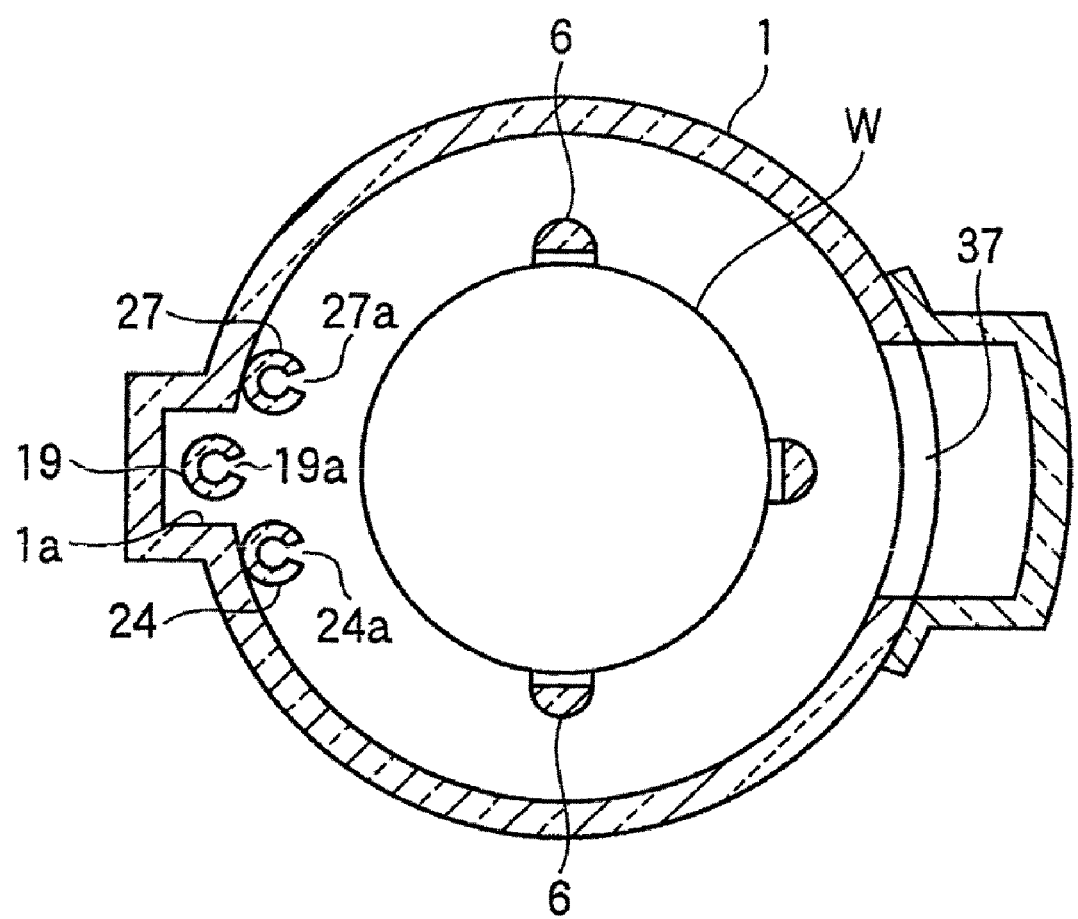
FIG. 2 is a cross-sectional view of the film forming apparatus of FIG. 1.
Figure 3:
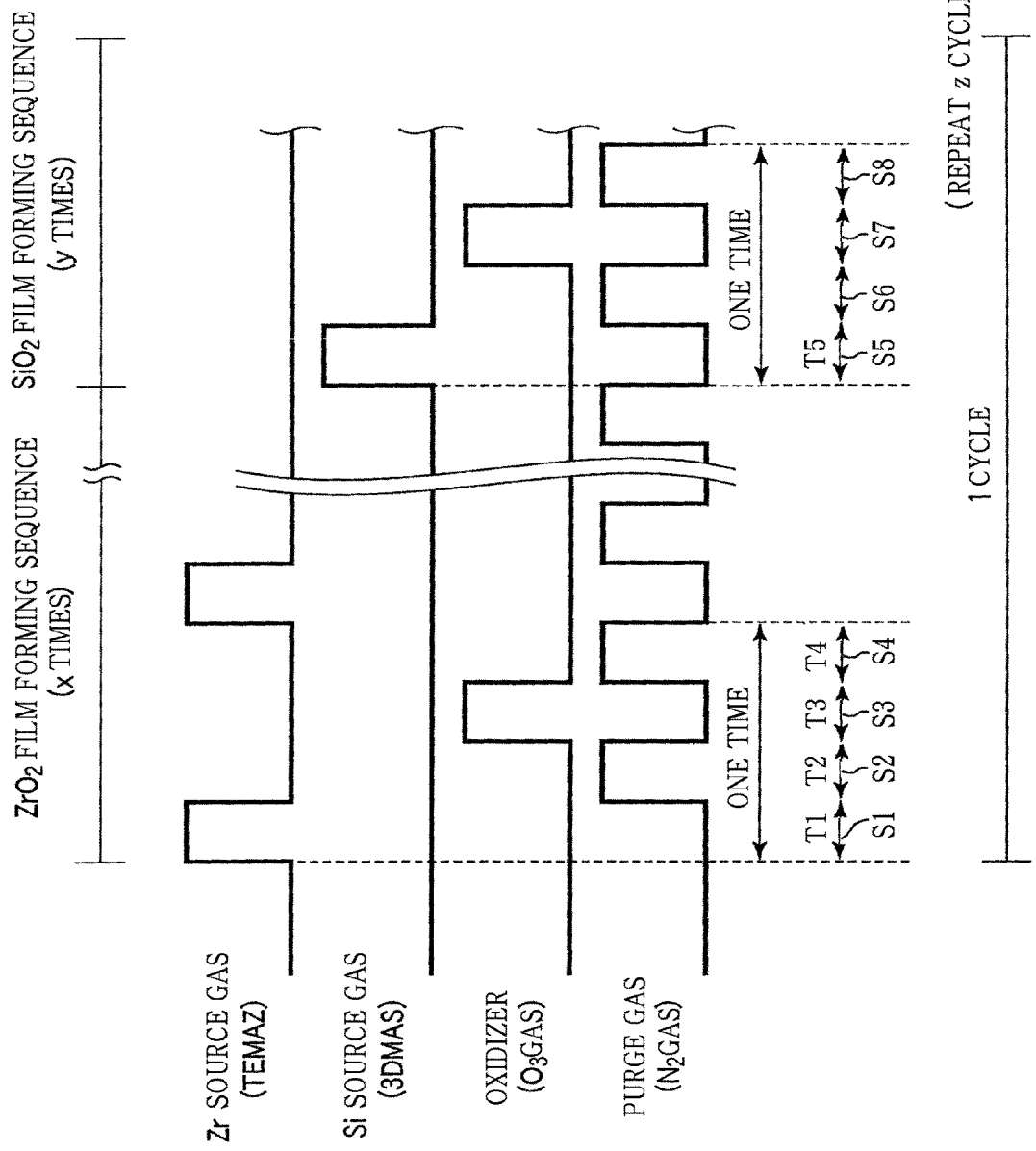
FIG. 3 is a timing chart showing timings of gas supply performed in a film forming method according to an embodiment of the present invention.

FIG. 1 is a longitudinal sectional view of a film forming apparatus for executing a film forming method according to an embodiment of the present invention, FIG. 2 is a cross-sectional view of the film forming apparatus of FIG. 1, and FIG. 3 is a timing chart showing timings of gas supply performed in a film forming method according to an embodiment of the present invention. Furthermore, a heating unit is omitted in FIG. 2.

The film forming apparatus 100 includes a cylindrical processing vessel 1 of which bottom is open and which has a ceiling. The processing vessel 1 is entirely formed of quartz, for example, and a top plate 2 formed of quartz is formed at the ceiling of the processing vessel 1 and seals the ceiling of the processing vessel 1. Furthermore, a manifold 3, which may be formed of stainless steel and may have a cylindrical shape, is connected to the open bottom of the processing vessel 1 via a sealing member 4, such as an O-ring.

The manifold 3 supports the bottom of the processing vessel 1, and a wafer boat 5 formed of quartz, on which a plurality of semiconductor wafers (hereinafter referred as wafers W), e.g. from 50 to 100 wafers W, as objects to be processed may be stacked in multiple layers, may be inserted from below the manifold 3 into the processing vessel 1. The wafer boat 5 includes three pillars 6 (refer to FIG. 2), and a plurality of wafers W are supported by grooves formed in the pillars 6.

The wafer boat 5 is disposed on a table 8 via a thermos vessel 7 formed of quartz, and the table 8 is disposed on and supported by an rotating shaft 10 which penetrates a cover unit 9 for opening and closing the open bottom of the manifold 3, wherein the cover unit 9 may be formed of stainless steel.

A magnetic fluid seal 11 may be formed where the rotating shaft 10 penetrates the cover unit 9, and closely seals the rotating shaft 10 and rotatably supports the rotating shaft 10. Furthermore, a sealing member 12, which may be an O-ring, is interposed between the peripheral portion of the cover unit 9 and the bottom surface of the manifold 3, to maintain sealing of the processing vessel 1.

The rotating shaft 10 is attached to a leading end of an arm 13 supported by an elevating mechanism (not shown), such as a boat elevator, and is configured to elevate the wafer boat 5 and the cover unit 9 together so as to be inserted into and pulled out from the processing vessel 1. Also, the table 8 may be formed fixed to the cover unit 9, and the wafers W may be processed without rotating the wafer boat 5.

The film forming apparatus 100 includes an oxidizer supply mechanism 14, which supplies an oxidizer gas (e.g. O$_3$ gas) into the processing vessel 1, a Zr source gas supply mechanism 15, which supplies Zr source gas (zirconium source material) into the processing vessel 1, and a Si source gas supply mechanism 16, which supplies Si source gas (silicon source material) into the processing vessel 1. Furthermore, the film forming apparatus 100 further includes a purge gas supply mechanism 28, which supplies an inert gas (e.g. N$_2$ gas) as a purge gas into the processing vessel 1.

The oxidizer supply mechanism 14 includes: an oxidizer source 17; an oxidizer piping 18 which guides an oxidizer from the oxidizer source 17; and an oxidizer spreading nozzle 19, wherein the oxidizer spreading nozzle 19 is a pipe which is formed of quartz, is connected to the oxidizer piping 18, penetrates a sidewall of the manifold 3 inwardly, is bent upward, and vertically extends upward. A plurality of gas ejecting holes 19a are formed apart from each other in the vertically extending portion of the oxidizer spreading nozzle 19, so that the oxidizer, e.g. O$_3$ gas, may be ejected from each of the gas ejecting holes 19a almost uniformly in a horizontal direction toward the processing vessel 1. Examples of the oxidizer may be not only O$_3$ gas, but also be H$_2$O gas, O$_2$ gas, NO$_2$ gas, NO gas, N$_2$O gas, or the like. A plasma generating mechanism may be formed to plasmarize an oxidizer so as to obtain higher reactivity. Also, O$_2$ gas and H$_2$ gas may be used for radical oxidization. In case of using O$_3$ gas, it is assumed that an ozonizer, which generates O$_3$ gas, is disposed as the oxidizer source 17.

The Zr gas supply mechanism 15 includes a Zr source container vessel 20, which contains liquefied Zr source (e.g. tetrakis(ethylmethylamino)zirconium; TEMAZ), a Zr source piping 21, which guides the liquefied Zr source from the Zr source container vessel 20, a vaporizing unit 22, which is connected to the Zr source piping 21 and evaporates the liquefied Zr source, a Zr source gas piping 23, which guides Zr source gas generated by the vaporizing unit 22, and a Zr source gas spreading nozzle 24, wherein the Zr source gas spreading nozzle 24 is a pipe which is formed of quartz, is connected to the Zr source gas piping 23, penetrates a sidewall of the manifold 3 inwardly, is bent upward, and vertically extends upward. A carrier gas piping 22a, which supplies $N_2$ gas as carrier gas, is connected to the vaporizing unit 22. A plurality of gas ejecting holes 24a are formed apart from each other in the vertically extending portion of the Zr source gas spreading nozzle 24, so that Zr source gas may be ejected from each of the gas ejecting holes 24a uniformly in a horizontal direction into the processing vessel 1.

The Si source gas supply mechanism 16 includes a Si source container vessel 25, which contains liquefied Si source (e.g. trisdimethylaminosilane; 3DMAS), a heater 25a, which is formed around the Si source container vessel 25 to evaporate liquefied Si source, a Si source gas piping 26, which guides Si source gas evaporated by the vaporizing unit 22 in the Si source container vessel 20, and a Si source gas spreading nozzle 27, which is connected to the Si source gas piping 26 and penetrates a sidewall of the manifold 3. A plurality of gas ejecting holes 27a are formed apart from each other on the Si source gas spreading nozzle 27 in the lengthwise direction of the Si source gas spreading nozzle 27, so that Si source gas may be ejected from each of the gas ejecting holes 27a almost uniformly in horizontal direction into the processing vessel 1.

Furthermore, the purge gas supply mechanism 28 includes a purge gas supply source 29, a purge gas piping 30, which guides purge gas from the purge gas supply source 29, and a purge gas nozzle 31, which is connected to the purge gas piping 30 and penetrates a sidewall of the manifold 3. An inert gas, e.g. $N_2$ gas, may be suitable as the purge gas.

An opening valve 18a and a flux controller 18b, such as a mass-flow controller, are formed on the oxidizer piping 18, so that flux of oxidizer gas to be supplied may be controlled. Furthermore, an opening valve 26a and a flux controller 26b, such as a mass-flow controller, are also formed on the Si source gas piping 26, so that flux of Si source gas to be supplied may be controlled. Furthermore, an opening valve 30a and a flux controller 30b, such as a mass-flow controller, are formed on the purge gas piping 30, so that flux of purge gas to be supplied may be controlled.

A Zr source pumping pipe 20a is inserted into the Zr source container vessel 20, and liquefied Zr source is supplied to the Zr source piping 21 by supplying a pumping gas, e.g. He gas, via the Zr source pumping pipe 20a. A flux controller 21a, such as a liquid mass-flow controller, is formed on the Zr source pressurizing pipe 21, whereas a valve 23a is formed on the Zr source gas pipe 23.

There are no limits in Zr source, and various types of Zr sources may be used as long as a $ZrO_2$ film may be formed. From among Zr sources, an organic metal compound that is liquid at the room temperature, such as TEMAZ stated above, may be suitable. Also, tetrakis(diethylamino)zirconium, which is another organic metal compound that is liquid at the room temperature, may be used. A Zr source that is solid at the room temperature may also be used. However, in this case, a mechanism for evaporating the Zr source and a mechanism for heating a pipe are further required.

There are no limits in Si source, and various types of Si sources may be used as long as a $SiO_2$ film may be formed. From among Si sources, an organic metal compound, such as 3DMAS stated above, may be suitable. Also, other organic metal compounds, such as tetra-dimethylaminosilane (4DMAS) and bis(tertiärbutylamino)silane (BTBAS), may be used as Si source.

The oxidizer spreading nozzle 19 for ejecting and spreading an oxidizer is formed in a concave portion 1a of the processing vessel 1, and the Zr source gas spreading nozzle 24 and the Si source gas spreading nozzle 27 are formed to interpose the oxidizer spreading nozzle 19 therebetween.

An exhaust hole 37 for vacuum-exhausting the processing vessel 1 is formed on a portion of the sidewall of the processing vessel 1, the portion being opposite to a portion in which the oxidizer spreading nozzle 19 and the Zr source gas spreading nozzle 24 are formed. The exhaust nozzle 37 is formed to be long and narrow by cutting a portion of the sidewall of the processing vessel 1 in vertical direction. A exhaust hole covering unit 38, which has a U-shaped cross-section to cover the exhaust hole 37, is weld-attached to the portion of the processing vessel 1, the portion corresponding to the exhaust hole 37. The exhaust hole covering unit 38 extends upward along the sidewall of the processing vessel 1, and defines a gas outlet 39 that extends upward along the processing vessel 1. Furthermore, gas in the processing vessel 1 is vacuum-sucked from the gas outlet 39 by a vacuum-exhausting mechanism (not shown), such as a vacuum pump. Furthermore, a heating unit 40 that has a barrel shape and heats the processing vessel 1 and the wafers W therein is formed to surround the outer surface of the processing vessel 1.

A controller 50, which includes a microprocessor (computer), controls each of components of the film forming apparatus 100. For example, the controller 50 controls supplying/stopping of each of gas by opening/closing the valves 18a, 23a, 26a, and 30a, controls flux of gas or liquefied source via the flux controllers 18b, 21a, 26b, and 30b, switches gas injected into the processing vessel 1, and controls the heating unit 40. A user interface 51 is connected to the controller 50 so that an operator may manage the film forming apparatus 100. The user interface 51 may be a keyboard to input commands, a display apparatus to visually display operational status, or the like.

Furthermore, a memory device 52, which contains a recipe, such as, a control program, which instructs to perform various operations of the film forming apparatus 100 under the control of the controller 50, or a program for instructing each of the components of the film forming apparatus 100 to execute a particular operation, is connected to the controller 50. The recipe is stored in a recording medium in the memory device 52. The recording medium may be a fixedly formed one such as a hard disk, or may be a mobile one such as a CD-ROM, a DVD, and a flash memory. Also, recipes may be transmitted from another apparatus via a dedicated line.

Furthermore, if required, a desired operation may be performed by the film forming apparatus 100 under the control of the controller 50 by loading a random recipe from the memory unit 52 according to an instruction from the user interface 51 and performing the random recipe.

Next, a film forming method performed in the film forming apparatus 100 having a configuration as described above will be described in reference to FIG. 3.

First, at the room temperature, the wafer boat 5, on which a plurality of wafers W, e.g. from 50 to 100 wafers W, are stacked, is loaded into the processing vessel 1, which is set at a predetermined temperature in advance, by being lifted from below the processing vessel 1, and the opening on the bottom surface of the manifold 3 is covered with the cover unit 9 so that the processing vessel 1 is tightly sealed. For example, the diameter of the wafer W is 300 mm.

Then, the processing vessel 1 is vacuum-sucked to maintain the internal pressure of the processing vessel 1 at a predetermined processing pressure. At the same time, power supplied to the heating unit 40 is controlled to increase the temperature of the wafers W to a processing temperature, and the wafer boat 5 is rotated. In this state, a film forming process begins. The processing temperature may be from about 200° C. to about 300° C., and may be 210° C., for example.

During the film forming process, as shown in FIG. 3, one $ZrO_2$ film forming sequence includes an operation S1 of supplying Zr source gas into the processing vessel 1 so that the Zr source gas is adhered to the wafers W, an operation S2 of purging the interior of the processing vessel 1 by using purge gas, an operation S3 of oxidizing the Zr source gas by supplying a gas-state oxidizer (e.g. $O_3$ gas) into the processing vessel 1, and an operation S4 of purging the interior of the processing vessel 1 by using purge gas, and a $ZrO_2$ film is formed by repeating the $ZrO_2$ film forming sequence for x times (x is an integer equal to or greater than 2).

Next, one $SiO_2$ film forming sequence includes an operation S5 of supplying Si source gas into the processing vessel 1 so that the Si source gas is adhered to the wafers W, an operation S6 of purging the interior of the processing vessel 1 by using purge gas, an operation S7 of oxidizing the Si source gas by supplying a gas-state oxidizer (e.g. $O_3$ gas) into the processing vessel 1, and an operation S8 of purging the interior of the processing vessel 1 by using purge gas, and a $SiO_2$ film is formed by repeating the $SiO_2$ film forming sequence for y times (y is an integer equal to or greater than 1).

x times of $ZrO_2$ film forming sequences and y times of $SiO_2$ film forming sequences are considered as one cycle, and the cycle is repeated for z times, so that a film has a predetermined thickness. The z is set to have a suitable value, that is, 1 or greater, according to a desired thickness of a zirconia-based film. Furthermore, the order of the formation of the $ZrO_2$ film and the formation the $SiO_2$ film may be reverse.

Next, a crystallized zirconia-based film is formed by annealing the film if required. In this case, an annealing temperature may be lower than or equal to 450° C. If the annealing temperature exceeds 450° C., it may cause adverse effects to a semiconductor device.

Here, the values of x and y are determined such that Si concentration of the zirconia-based film is from about 1 atm % to about 4 atm %. If Si concentration is less than 1 atm %, no sufficient effects are obtained. On the other hand, if Si concentration exceeds 4 atm %, a film which is formed becomes amorphous, and thus permittivity of the film is lowered. Preferably, Si concentration of a zirconia-based film is from about 2 atm % to about 4 atm %.

Figure 4:
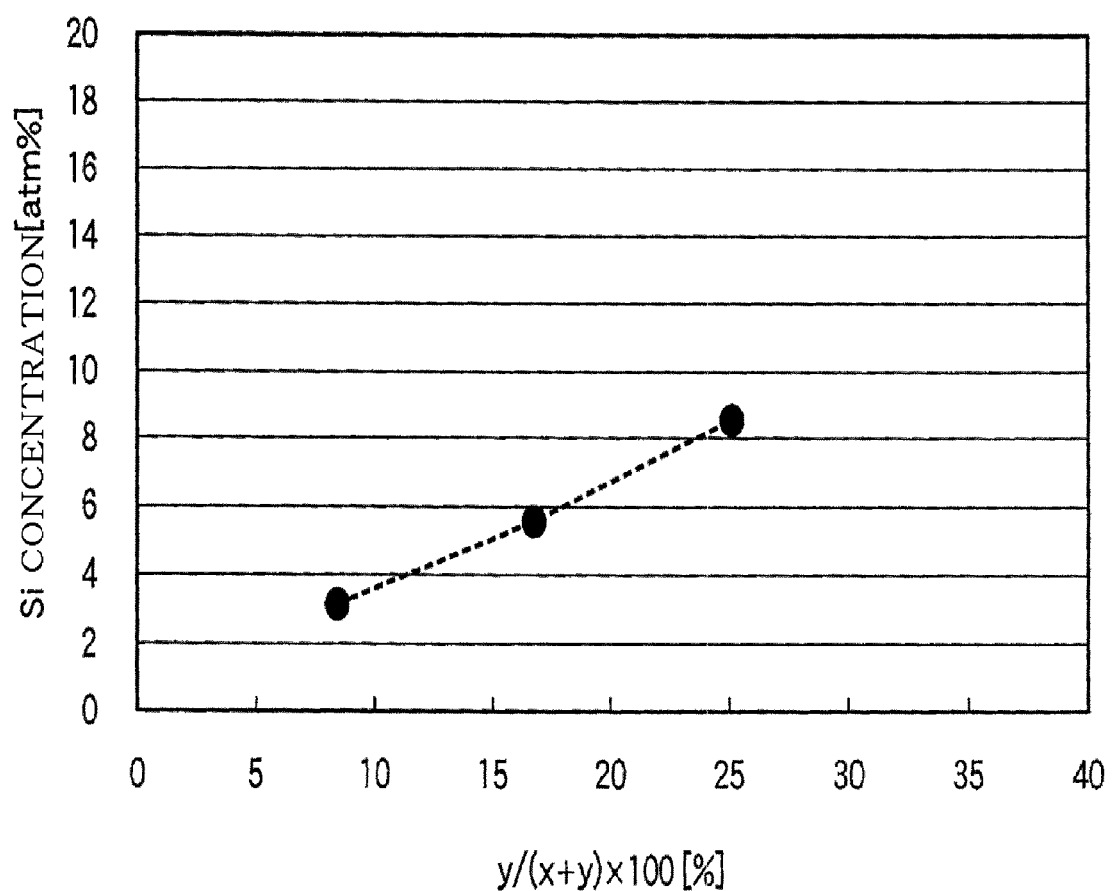
FIG. 4 is a graph showing a relationship between a ratio of the number of times a SiO$_2$ film forming sequence is performed and Si concentration of a film.

Si concentration in a zirconia-based film is almost proportional to $y/(x+y)$, which is a ratio of the number of times y which Si source is supplied. For example, in case where TEMAZ is used as Zr source, 3DMAS is used as Si source, a film is formed according to the film forming method described above under conditions of 1 Torr (133.3 Pa) and 210° C., and the film is then annealed at 450° C., a relationship between $y/(x+y) \times 100[\%]$ and Si concentration [atm %] in the film is as shown in FIG. 4. Detailed descriptions regarding FIG. 4 will be given below. For example, as shown in FIG. 4, to obtain a film of which Si concentration is 3 atm %, it is clear that a ratio of y, $(y/(x+y) \times 100)(\%)$, may be about 8.3%, that is, the number of times y the $SiO_2$ film forming sequence is performed may be 1 when the number of times x the $ZrO_2$ film forming sequence is performed is 11. If the graph as shown in FIG. 4 is prepared in advance, a film may be formed with suitable x value and y value to obtain desired Si concentration.

In the operation S1, Zr source, e.g. TEMAZ, is supplied from the Zr source container vessel 20 of the Zr source gas supplying unit 15, and Zr source gas, which is generated by vaporizing the Zr source using the vaporizing unit 22, is supplied into the processing vessel via the Zr source gas piping 23 and the Zr source gas spreading nozzle 24 for a time period T1. Thus, Zr source is adhered to the wafers W. Here, for example, the time period T1 may be from 1 second to 120 seconds. Furthermore, for example, the flux of Zr source may be from about 0.2 mL/min(sccm) to about 0.5 mL/min(sccm). Furthermore, for example, the internal pressure of the processing vessel 1 may be from about 10 Pa to about 100 Pa.

In the operation S3 of supplying an oxidizer, an oxidizer, e.g. $O_3$ gas, is ejected from the oxidizer source 17 of the oxidizer supplying unit 14 via the oxidizer piping 18 and the oxidizer spreading nozzle 19. Therefore, the Zr source attached to the wafers W is oxidized, and thus $ZrO_2$ is obtained.

Preferably, a time period T3 for performing the operation S3 may be from 10 seconds to 180 seconds. Although the flux of the oxidizer varies according to the number of wafers W stacked or the type of oxidizer, the flux of the oxidizer may be, for example, from about 100 g/Nm³ to about 200 g/Nm³, in case where $O_3$ gas is used as the oxidizer and from 50 to 100 wafers W are stacked. Furthermore, for example, in this case, the internal pressure of the processing vessel 1 may be from about 10 Pa to about 100 Pa.

The operations S2 and S4 are operations of purging a gas remaining in the processing vessel 1 after the operation S1 or the operation S3, so that a desired reaction may occur during next operation. In the operations S2 and S4, the purge gas supply source 29 of the purge gas supplying unit 28 supplies purge gas, e.g. $N_2$ gas, into the processing vessel 1 via the purge gas piping 30 and the purge gas nozzle 31, so that the interior of the processing vessel 1 is purged. In this case, vacuum-sucking and supplying purge gas may be repeated for a plurality of times to increase efficiency of removing remaining gas. Time periods T2 and T4 respectively for the operations S2 and S4 may be from 20 seconds to 120 seconds. Furthermore, for example, the internal pressure of the processing vessel 1 may be from about 10 Pa to about 100 Pa. At this point, the operation S2 after the operation S1 of supplying Zr source gas and the operation S4 after the operation S3 of supplying an oxidizer may employ respectively different time periods for vacuum-sucking and supplying purge gas, in consideration of a difference between the degrees of exhaustions of gases in the operations S2 and S4. More particularly, time periods regarding the operation S2 may be longer than those regarding the operation S4, because it takes longer time period to exhaust gas after the operation S1 than the operation S3.

In the operation S5, Si source, e.g. 3DMAS, contained in the Si source container vessel 25 of the Si source gas supplying unit 16, is vaporized by the heater 25a, and Si source gas generated by the vaporization is supplied into the processing vessel 1 via the Si source gas piping 26 and the Si source gas spreading nozzle 27 for a time period T5. Thus, Si source is adhered to the wafers W. Here, for example, the time period T5 may be from 10 seconds to 60 seconds. Furthermore, for example, the flux of Si source gas may be from about 50 mL/min(sccm) to about 300 mL/min(sccm). Furthermore, the internal pressure of the processing vessel 1 may be from about 10 Pa to about 100 Pa.

The operation S7 of supplying an oxidizer is same as the operation S3. Furthermore, the operations S6 and S8 of purging the interior of the processing vessel 1 by supplying purge gas are same as the operation S2 and S4. The operation S6 after the operation S5 of supplying Si source gas and the operation S8 after the operation S7 of supplying an oxidizer may employ respectively different time periods for vacuum-sucking and supplying purge gas, in consideration of a difference between the degrees of exhaustions of gases in the operations S5 and S7. More particularly, time periods regarding the operation S6 may be longer than those regarding the operation S8, because it takes longer time period to exhaust gas after the operation S5.

Accordingly, a zirconia-based film doped with from about 1 atm % to about 4 atm % of Si may be formed by performing one or more cycles, each of which includes formation of a $ZrO_2$ film, which becomes a base, due to alternate supply of Zr source gas and an oxidizer for a plural number of times and formation of a $SiO_2$ film due to alternate supply of Si source gas and an oxidizer once or plural number of times, and by performing annealing operation thereafter if necessary. Thus, the zirconia-based film may maintain zirconia crystals, and thus the zirconia-based film may maintain high permittivity and may reduce leakage current significantly. It is presumed that, since Si of such small quantity exists in grain boundaries of zirconia crystal, the zirconia crystal may not be damaged. Furthermore, it is presumed that, since the Si covers the grain boundaries of the zirconia crystal, leakage from the grain boundaries of zirconia crystals may be prevented. Furthermore, containment of about 3 atm % of Si in a zirconia-based film increases zirconia crystal grain and thus reduces grain boundaries. This also contributes to prevent the leakage from the grain boundaries of zirconia crystals. Furthermore, increase in zirconia crystal grain contributes to increases in permittivity. Thus, the zirconia-based film containing about 3 atm % of Si exhibits higher permittivity than a zirconia film containing no Si, and also exhibits an excellent characteristic that leakage current of the zirconia-based film containing about 3 atm % of Si is approximately 100 times less than that of the zirconia film containing no Si.

Next, an experiment, which is the basis of the present invention, will be described below.

In the experiment, a film was formed on a wafer by using the film forming apparatus 100 of FIG. 1 according to the timing chart shown in FIG. 3, wherein TEMAZ was used as Zr source, 3DMAS was used as Si source, and $O_3$ gas was used as an oxidizer.

A zirconia-based film was formed by adjusting Si concentration of the zirconia-based film due to changes of the number of times, x, the $ZrO_2$ film forming sequence is repeated, and the number of times, y, the $SiO_2$ film forming sequence is repeated and thus by adjusting the total number of cycles, z, such that the zirconia-based film has a predetermined overall thickness. Then, the obtained film was annealed at 450° C. for 30 minutes in the processing vessel 1 containing $N_2$ atmosphere of 1 Torr (133.3 Pa).

As a sample 1, a film was formed to have an overall thickness of 13.76 nm by using x=11, y=1, and z=8. As a sample 2, a film was formed to have an overall thickness of 13.80 nm by using x=5, y=1, and z=16. As a sample 3, a film was formed to have an overall thickness of 13.00 nm by using x=3, y=1, and z=25. When Si concentrations of the samples 1 through 3 were analyzed using the Rutherford backscattering spectroscopy (RBS), Si concentration of the sample 1 was 3.1 atm %, Si concentration of the sample 2 was 5.5 atm %, and Si concentration of the sample 3 was 8.5 atm %. The relationship between (y/(x+y)×100)(%) and Si concentration of FIG. 4 is based on the result of the analysis.

Figure 5:
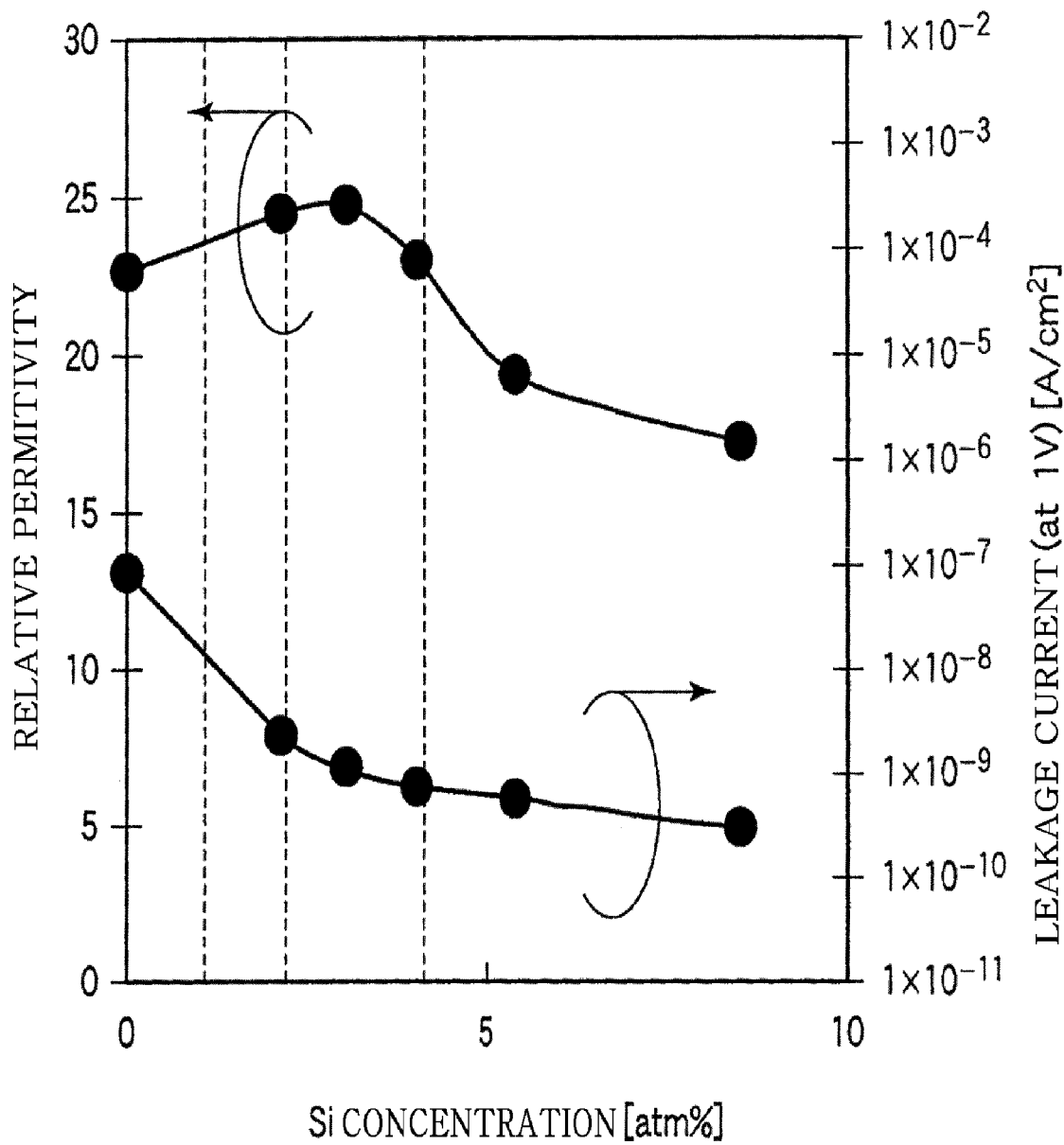
FIG. 5 is a graph showing relationships among Si concentration of a film, permittivity of the film, and leak current of the film.

Other than the samples 1 through 3, a film was formed as a sample 4 to have Si concentration of 4 atm % and a thickness of 12.80 nm by using x=9, y=1, and z=9, a film was formed as a sample 5 to have Si concentration of 2 atm % and a thickness of 13.80 nm by using x=18, y=1, and z=5, and a film was formed as a sample 6 to have Si concentration of 0 atm % and a thickness of 12.90 nm by repeating only the $ZrO_2$ film forming sequence 86 times. Then, relative permittivity and leakage current of each of the samples 4 through 6 were measured. Here, the measured leakage current corresponds to leakage current when voltage of 1 V is applied. Results of the measurements are arranged in FIG. 5. FIG. 5 is a graph showing relationships among Si concentration of a film, permittivity of the film, and leak current of the film, wherein the horizontal axis indicates Si concentration of a film, and the vertical axes indicate relative permittivity and leakage current. As shown in FIG. 5, as the Si concentration rises from zero, the relative permittivity tends to increase, whereas the leakage current tends to decrease. When the Si concentration is 3.1 atm %, the relative permittivity is at the peak being about 25. When the Si concentration exceeds 3.1 atm %, the relative permittivity decreases. When the Si concentration is 4 atm %, the relative permittivity is almost same as the sample 6 which contains no Si. When the Si concentration exceeds 4 atm %, the relative permittivity becomes even lower than the sample 6 which contains no Si. Meanwhile, the leakage current rapidly decreases as the Si concentration approaches to 2 atm %, and decreases further when the Si concentration is 2 atm % or greater. While the leakage current of the sample 6 which contains no Si was $1\times10^{-7}$ $A/cm^2$, leakage current of a film of which Si concentration is 2 atm % or greater was $10^{-9}$ $A/cm^2$ order or less, and thus the leakage current of the film of which Si concentration is 2 atm % or greater was approximately 100 times less than that of the sample 6. Although there is no plot when Si concentration is 1 atm %, FIG. 5 shows that 1 atm % of Si concentration is sufficiently effective.

Figure 6:
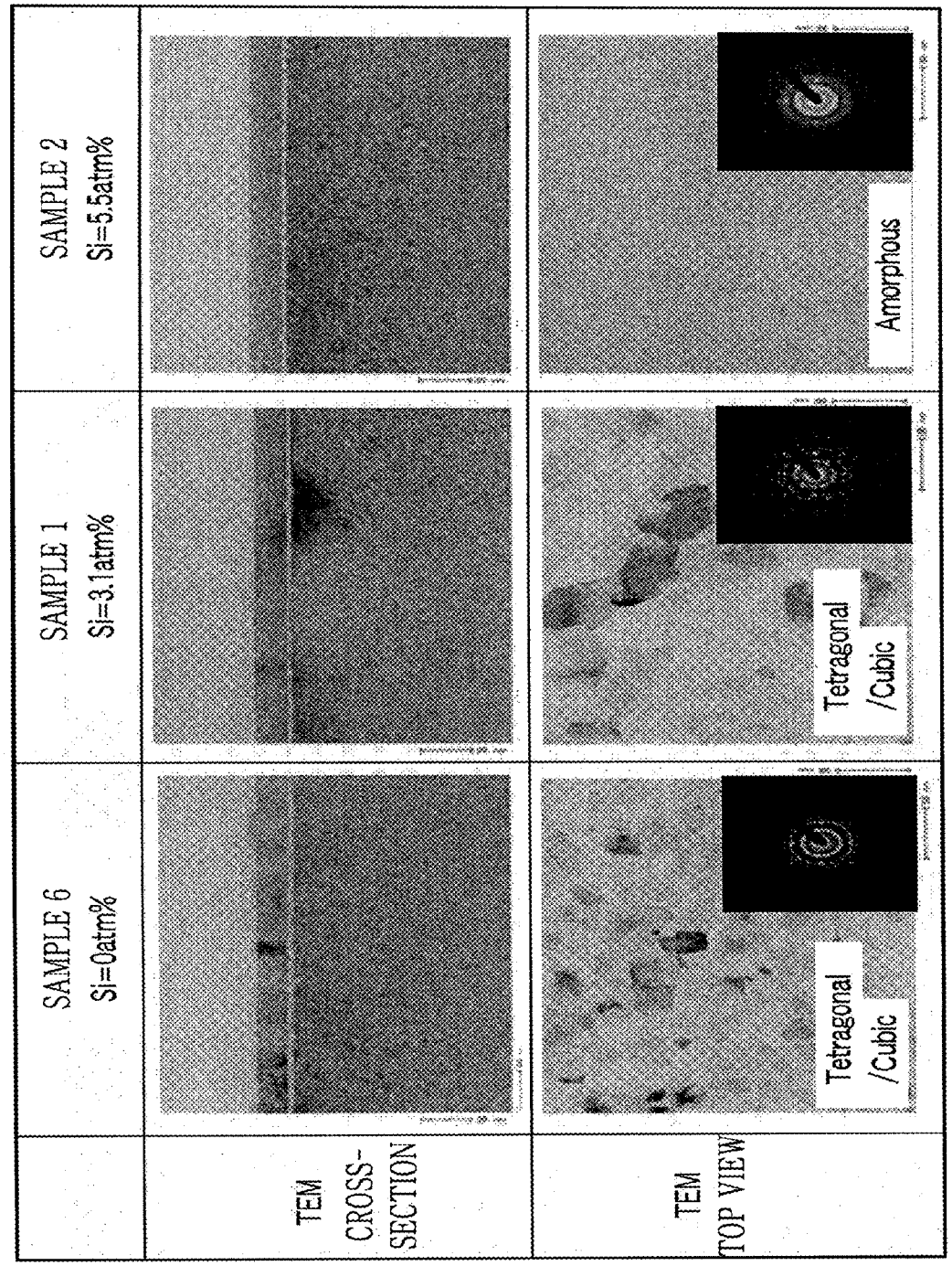
FIG. 6 is a transmission electron microscopic (TEM) photograph of a sample 6 (Si=0 atm %), a sample 1 (Si=3.1 atm %), and a sample 2 (Si=5.5 atm %)

Next, structures of films were observed using a transmission electron microscope (TEM) with respect to the sample 6 (Si=0 atm %), a sample 1 (Si=3.1 atm %), and a sample 2 (Si=5.5 atm %). Results of the observation are shown in FIG. 6. FIG. 6 shows TEM photographs of cross-sections and top views of the samples. It is confirmed that crystals are clearly observed in the sample 6 which contains no Si and in the sample 1 of which Si concentration is 3.1 atm %, whereas crystals are not observed in the sample 2 of which Si concentration is 5.5 atm %, and the sample 2 is in amorphous state. Furthermore, it is confirmed that the crystal of the sample 1 was larger than the crystals of the sample 6.

Figure 7:
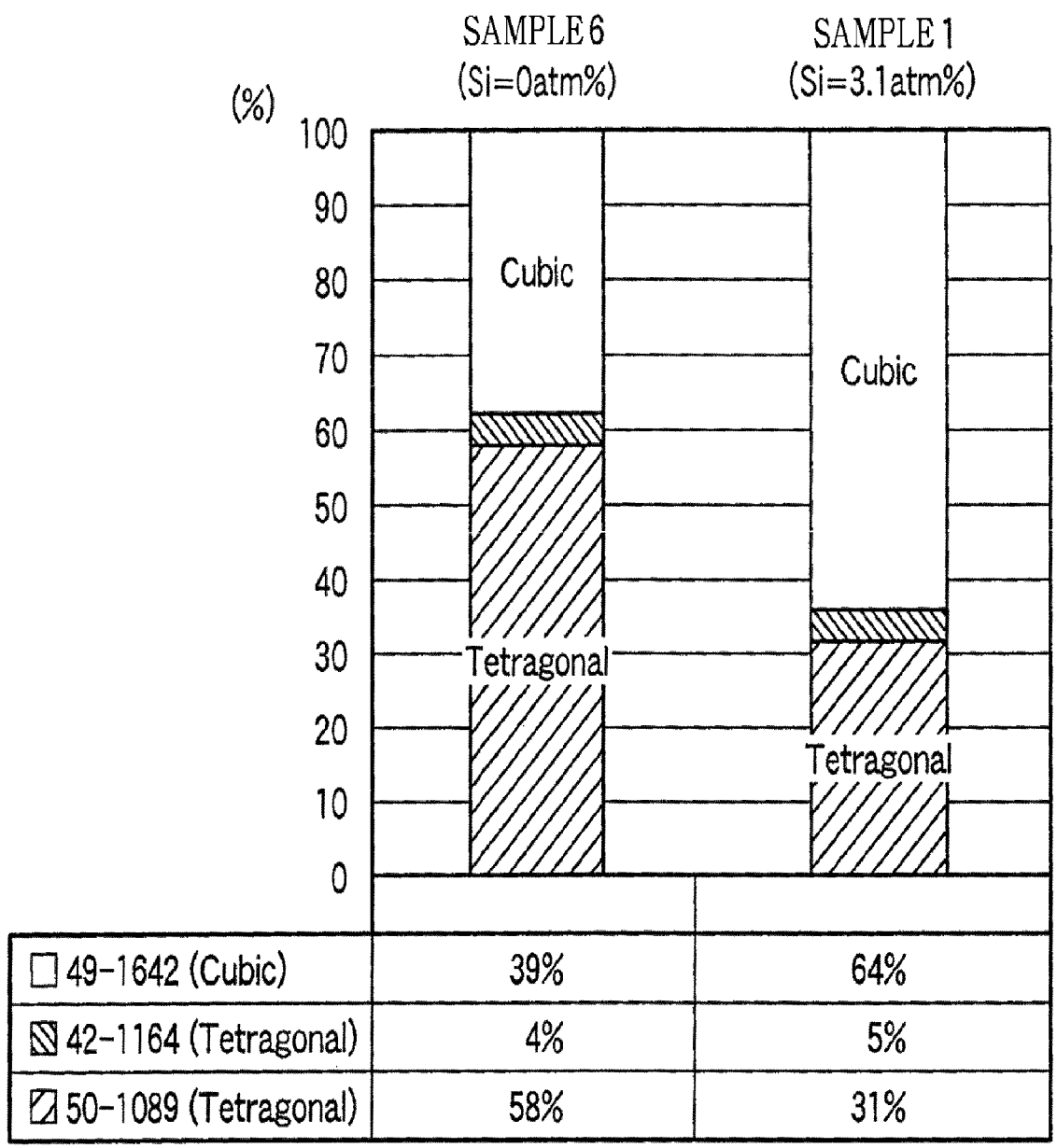
FIG. 7 is a diagram showing crystal structures of the sample 6 (Si=0 atm %) and the sample 1 (Si=3.1 atm %) confirmed using electron beam diffraction.

Next, crystal structures of the sample 6 (Si=0 atm %) and the sample 1 (Si=3.1 atm %), in which crystals were observed, were confirmed by using electron beam diffraction. Here, ratio of crystals were calculated from a diffraction strength of the peak and a "d" value that are obtained from the electron beam diffraction. Results of the calculation are shown in FIG. 7. As shown in FIG. 7, crystal structures of the films are cubic and tetragonal.

According to the results, it is confirmed that zirconia crystals are not significantly affected and maintains a crystal structure even if a small quantity of Si is added, whereas zirconia crystals are not maintained and become amorphous when Si concentration increases.

Figure 8:
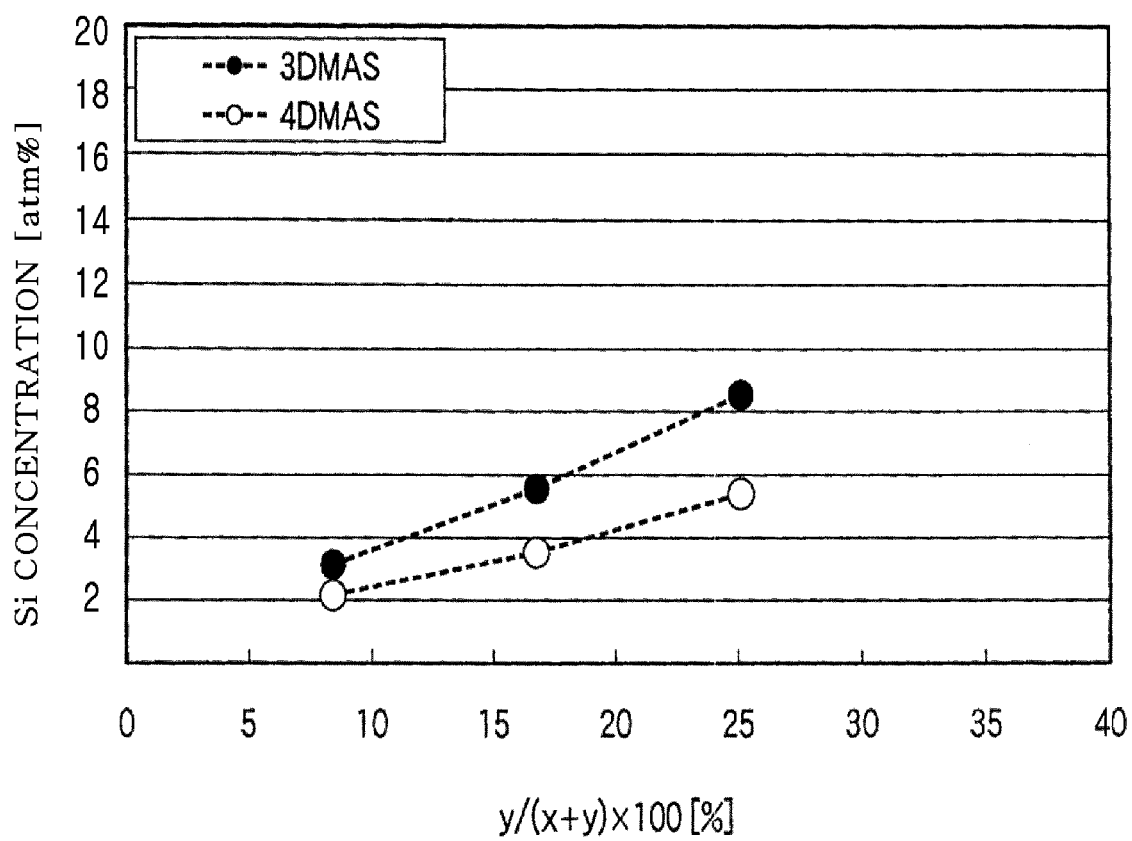
FIG. 8 is a graph showing relationships between a ratio of the number of times a SiO$_2$ film forming sequence is performed and Si concentration of a film, in cases where 3DMAS and 4DMAS are respectively used as Si source.

Next, different Si concentrations due to different Si sources will be described. Here, a difference between a relationship between y/(x+y)×100 and Si concentration in case where the 3DMAS is used as Si source and a relationship between y/(x+y)×100 and Si concentration in case where the 4DMAS is used as Si source was checked. The difference is shown in FIG. 8. As shown in FIG. 8, when films are formed under same conditions, it is confirmed that Si concentration of the case in which 4DMAS is used is lower than that of the case in which 3DMAS is used.

According to the present invention, zirconia-based film may be formed by using ALD technique in which silicon of 1~4 atm % is added to zirconia. Thus, grain boundary leakage may be suppressed while maintaining zirconia crystal. Therefore, zirconia-based film which has both characteristics of high permittivity and low leakage-current may be formed.

Furthermore, the present invention is not limited to the above embodiment, and various changes may be made therein. For example, although it is shown that the above embodiment is applied to a batch type film-forming apparatus, which is loaded with a plurality of wafers and performs film formations on the wafers in bulk, the above embodiment is not limited thereto and may be applied to a single type film-forming apparatus, which performs forms a film on a single wafer at a time.

Furthermore, although organic metal compounds are used as Zr source and Si source in the above embodiment, the above embodiment is not limited thereto, and inorganic metal compounds may also be used. However, it is more efficient to use organic metal compounds, which generate a large quantity of gas, as metal sources.

Furthermore, an object to be processed is not limited to a semiconductor wafer, and the present invention may also be applied to other types of substrates, such as an LCD glass substrate.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A film forming method comprising:
    inserting objects to be processed into a processing vessel that can be maintained vacuum, and making the processing vessel vacuum;
    performing a sequence of forming a $ZrO_2$ film on a substrate by alternately supplying a zirconium source and an oxidizer to the processing vessel a plurality of times and performing a sequence of forming a $SiO_2$ film on the substrate by alternately supplying a silicon source and the oxidizer to the processing vessel one or more times, wherein the number of times of performances of each of the sequences is adjusted such that Si concentration of the films is from about 1 atm % to about 4 atm %; and
    forming a zirconia-based film having a predetermined thickness by performing the film forming sequences for one or more cycles, wherein one cycle indicates that each of the $ZrO_2$ film forming sequences and the $SiO_2$ film forming sequences are repeated the adjusted number of times of performances.

2. The film forming method of claim 1, wherein the number of times the zirconium source and the oxidizer are supplied during the formation of the $ZrO_2$ film and the number of times the silicon source and the oxidizer are supplied during the formation of the $SiO_2$ film are adjusted such that the Si concentration of each of the films is from about 2 atm % to about 4 atm %.

3. The film forming method of claim 1, wherein a gas remaining in the processing vessel is exhausted between the supplying of the zirconium source and the supplying of the oxidizer and between the supplying of the silicon source and the supplying of the oxidizer.

4. The film forming method of claim 1, wherein, after forming the zirconia-based film, the obtained films are annealed at a temperature lower than or equal to 450° C.

5. The film forming method of claim 1, wherein the oxidizer is at least one selected from the group consisting of $O_3$ gas, $H_2O$ gas, $O_2$ gas, $NO_2$ gas, NO gas, $N_2O$ gas, and a radical of $O_2$ gas and $H_2$ gas.

6. The film forming method of claim 1, wherein the zirconium source and the silicon source are organic metal compounds.

7. The film forming method of claim 1, wherein a formed zirconia-based film has zirconia crystals.

8. The film forming method of claim 1, wherein the Si concentration of the films is adjusted in proportion to a ratio of the number of times which the Si source is supplied.

9. A non-transitory computer readable recording medium having recorded thereon a computer program for executing the film forming method of claim 1.

* * * * *